(12) United States Patent
Gunnam

(10) Patent No.: US 8,423,861 B2
(45) Date of Patent: Apr. 16, 2013

(54) SUBWORDS CODING USING DIFFERENT INTERLEAVING SCHEMES

(75) Inventor: Kiran Gunnam, San Jose, CA (US)

(73) Assignee: LSI Corporation, San Jose, CA (US)

( * ) Notice: Subject to any disclaimer, the term of this patent is extended or adjusted under 35 U.S.C. 154(b) by 623 days.

(21) Appl. No.: 12/644,314

(22) Filed: Dec. 22, 2009

(65) Prior Publication Data

US 2011/0119056 A1    May 19, 2011

Related U.S. Application Data

(60) Provisional application No. 61/262,721, filed on Nov. 19, 2009.

(51) Int. Cl.
*H03M 13/00* (2006.01)

(52) U.S. Cl.
USPC .......................... 714/753; 714/761; 714/762

(58) Field of Classification Search .................. None
See application file for complete search history.

(56) References Cited

U.S. PATENT DOCUMENTS

| | | | |
|---|---|---|---|
| 5,287,491 A | 2/1994 | Hsu | |
| 5,757,795 A | 5/1998 | Schnell | |
| 6,157,643 A | 12/2000 | Ma | |
| 7,181,676 B2 | 2/2007 | Hocevar | |
| 7,911,364 B1 * | 3/2011 | Zhang et al. | 341/81 |
| 8,065,598 B1 | 11/2011 | Gunnam et al. | |
| 8,099,561 B2 | 1/2012 | Bayer et al. | |
| 8,161,345 B2 | 4/2012 | Graef | |
| 8,170,129 B2 | 5/2012 | Chang et al. | |
| 8,265,070 B2 | 9/2012 | Khanduri | |
| 2001/0007608 A1 | 7/2001 | Sugita et al. | |
| 2002/0108030 A1 | 8/2002 | Lee et al. | |
| 2003/0112797 A1 | 6/2003 | Li et al. | |
| 2005/0015234 A1 | 1/2005 | Bhattacharya et al. | |
| 2005/0193320 A1 | 9/2005 | Varnica et al. | |
| 2005/0204255 A1 | 9/2005 | Yeh et al. | |
| 2005/0283707 A1 | 12/2005 | Sharon et al. | |
| 2006/0107181 A1 | 5/2006 | Dave et al. | |
| 2006/0179401 A1 | 8/2006 | Nefedov | |
| 2006/0282712 A1 * | 12/2006 | Argon et al. | 714/701 |
| 2006/0285852 A1 | 12/2006 | Xi et al. | |
| 2007/0011569 A1 | 1/2007 | Vila Casado et al. | |
| 2007/0011573 A1 | 1/2007 | Farjadrad et al. | |

(Continued)

FOREIGN PATENT DOCUMENTS
WO    WO 2010/019168 A1    2/2010

OTHER PUBLICATIONS

Kiran Gunnam, Gwan Choi, Mark Yeary—"An LDPC decoding schedule for memory access reduction", IEEE International Conference on Acoustics, Speech, and Signal Processing (ICASSP) 2004, pp. 173-176, vol. I5.

(Continued)

*Primary Examiner* — Gabriel Chu

(74) *Attorney, Agent, or Firm* — Mendelsohn, Drucker & Associates, P.C.; Craig M. Brown; Steve Mendelsohn

(57) ABSTRACT

In a communications system that demultiplexes user data words into multiple sub-words for encoding and decoding within different subword-processing paths, the minimum distance between bit errors in an extrinsic codeword can be increased by having corresponding interleavers/deinterleavers in the different subword-processing paths use different interleaving/deinterleaving algorithms.

21 Claims, 4 Drawing Sheets

U.S. PATENT DOCUMENTS

| | | | |
|---|---|---|---|
| 2007/0011586 | A1 | 1/2007 | Belogolovyi et al. |
| 2007/0044006 | A1 | 2/2007 | Yang et al. |
| 2007/0071009 | A1 | 3/2007 | Nagaraj et al. |
| 2007/0124652 | A1 | 5/2007 | Litsyn et al. |
| 2007/0147481 | A1 | 6/2007 | Bottomley et al. |
| 2007/0162788 | A1 | 7/2007 | Moelker |
| 2007/0208988 | A1* | 9/2007 | Aman et al. ............... 714/761 |
| 2007/0234178 | A1 | 10/2007 | Richardson et al. |
| 2007/0234184 | A1 | 10/2007 | Richardson |
| 2008/0028272 | A1 | 1/2008 | Richardson |
| 2008/0056202 | A1 | 3/2008 | Kim et al. |
| 2008/0082868 | A1 | 4/2008 | Tran et al. |
| 2008/0104485 | A1 | 5/2008 | Lyakh et al. |
| 2008/0109701 | A1 | 5/2008 | Yu et al. |
| 2008/0126910 | A1 | 5/2008 | Venkatesan et al. |
| 2008/0148129 | A1 | 6/2008 | Moon |
| 2008/0163032 | A1 | 7/2008 | Lastras-Montano |
| 2008/0235561 | A1 | 9/2008 | Yang |
| 2008/0276156 | A1 | 11/2008 | Gunnam et al. |
| 2008/0301521 | A1 | 12/2008 | Gunnam et al. |
| 2008/0301536 | A1* | 12/2008 | Shin et al. ............... 714/786 |
| 2008/0320353 | A1* | 12/2008 | Blankenship et al. ....... 714/746 |
| 2009/0024909 | A1* | 1/2009 | Shen et al. ............... 714/800 |
| 2009/0077447 | A1* | 3/2009 | Buckley et al. ............ 714/757 |
| 2009/0083606 | A1* | 3/2009 | Choi et al. ............... 714/776 |
| 2009/0180535 | A1 | 7/2009 | Bretl et al. |
| 2009/0224801 | A1 | 9/2009 | Lewin |
| 2009/0273492 | A1 | 11/2009 | Yang et al. |
| 2010/0042806 | A1 | 2/2010 | Gunnam |
| 2010/0042890 | A1 | 2/2010 | Gunnam |
| 2010/0111014 | A1* | 5/2010 | Kang et al. .............. 370/329 |
| 2010/0118800 | A1* | 5/2010 | Kim et al. ............... 370/329 |
| 2010/0169738 | A1* | 7/2010 | Wu et al. ................ 714/752 |
| 2010/0189162 | A1 | 7/2010 | Yoshimoto et al. |
| 2010/0214857 | A1 | 8/2010 | Hsu et al. |
| 2011/0093762 | A1* | 4/2011 | Kwon et al. .............. 714/758 |
| 2012/0176856 | A1 | 7/2012 | Hsu et al. |

OTHER PUBLICATIONS

Stefan Landner, Olgica Milenkovic—"Algorithmic and Combinatorial Analysis of Trapping Sets in Structured LDPC Codes", International Conference on Wireless Networks, Communications and Mobile Computing, 2005, pp. 630-635, vol. 1.

Hao Zhong,Tong Zhang—"Block—LDPC: A Practical LDPC Coding System Design Approach", IEEE transactions on circuits and systems—I: Regular Papers, Apr. 2005, pp. 766-775, vol. 52.

Kiran K. Gunnam, Gwan S. Choi, Weihuang Wang, Euncheol Kim, and Mark B. Yeary—"Decoding of Quasi-cyclic LDPC Codes Using an On-the-Fly Computation", Fortieth Asilomar Conference on Signals, Systems and Computers (ACSSC), 2006, pp. 1192-1199.

Thomas J. Richardson and Rudiger L. Urbanke—"Efficient Encoding of Low-Density Parity-Check Codes", IEEE Transactions on Information Theory, Feb. 2001,pp. 638-656,vol. 47, No. 2.

Tom Richardson—"Error Floors of LDPC Codes", IEEE Transactions on Information Theory, Feb. 2001, pp. 1426-1435,vol. 47, No. 2.

E. Papagiannis, C. Tjhai, M. Ahmed, M. Ambroze, M. Tomlinson—"Improved Iterative Decoding for Perpendicular Magnetic Recording", The ISCTA 2005 Conference on Feb. 4, 2005,pp. 1-4.

Kiran K. Gunnam, Gwan S. Choi, and Mark B. Yeary—"A Parallel VLSI Architecture for Layered Decoding for Array LDPC Codes", 20th International Conference on VLSI Design, 2007,6th International Conference on Embedded Systems, Jan. 2007 pp. 738-743.

David J.C. MacKay—"Information Theory, Inference, and Learning Algorithms", Cambridge University Press Sep. 2003, pp. 640.

R. Michael Tanner, Deepak Sridhara, Arvind Sridharan, Thomas E. Fuja, and Daniel J. Costello, Jr—"LDPC Block and Convolutional Codes Based on Circulant Matrices", IEEE Transactions on Information Theory, Dec. 2004, pp. 2966-2984, vol. 50, No. 12.

Amin Shokrollahi—"LDPC Codes: An Introduction, In Coding, Cryptography and Combinatorics",Computer Science and Applied Logic, Birkhauser, Basel, 2004, pp. 85-110, vol. 23.

Yang Han and William E. Ryan—"LDPC Decoder Strategies for Achieving Low Error Floors", Proceedings of Information Theory and Applications Workshop, San Diego, CA, Jan. 2008, pp. 1-10.

Mohammad M. Mansour and Naresh R. Shanbhag—"Low Power VLSI decoder architectures for LDPC codes" International Symposium on Low Power Electronics and Design Proceedings of the 2002 , ICIMS Research Center, 2002, pp. 284-289.

Dale E. Hocevar—"A Reduced Complexity Decoder Architecture Via Layered Decoding of LDPC Codes", IEEE Workshop on Signal Processing Systems, 2004, pp. 107-112.

Robert G. Gallager—"Low Density Parity—Check Codes",Cambridge Mass Jul. 1963,p. 90.

T. Richardson and R. Urbanke—"Modern Coding Theory", Cambridge University Press, Preliminary version—Oct. 18, 2007, p. 590.

Kiran Gunnam, Gwan Choi, Weihuang Wang, Mark Yeary—"Multi-Rate Layered Decoder Architecture for Block LDPC Codes of the IEEE 802, 11n Wireless Standard", IEEE International Symposium on Circuits and Systems (ISCAS) 2007, pp. 1645-1648.

Kiran K. Gunnam, Gwan S. Choi, Mark B. Yeary, Shaohua Yang and Yuanxing Lee—"Next Generation Iterative LDPC Solutions for Magnetic Recording Storage", 42nd Asilomar Conference on Signals, Systems and Computers, 2008, pp. 1148-1152.

D.J.C. MacKay and R.M. Neal—"Near Shannon limit performance of low density parity check codes", Electronics Letters Mar. 13, 1997, pp. 458-459, vol. 33 No. 6.

Jinghu Chen, Ajay Dholakia, Evangelos Eleftheriou, Marc P. C. Fossorier, Xiao-Yu Hu, "Reduced-Complexity Decoding of LDPC Codes", IEEE Transactions on Communications, Aug. 2005, pp. 1288-1299,vol. 53, No. 8.

Kiran K. Gunnam, Gwan S. Choi, Mark B. Yeary and Mohammed Atiquzzaman—"VLSI Architectures for Layered Decoding for Irregular LDPC Codes of WiMax", IEEE International Conference on Communications (ICC), 2007, pp. 4542-4547.

Andrew J. Blanksby and Chris J. Howland—"A 690-mW 1-Gb/s 1024-b, Rate-1/2 Low-Density Parity-Check Code Decoder", IEEE Journal of Solid-State Circuits, Mar. 2002.pp. 404-412,vol. 37, No. 3.

Kiran Gunnam, Weihuang Wang, Gwan Choi, Mark Yeary—"VLSI Architectures for Turbo Decoding Message Passing Using Min-Sum for Rate-Compatible Array LDPC Codes", 2nd International Symposium on Wireless Pervasive Computing (ISWPC), 2007, pp. 561-566.

Kiran K. Gunnam, Gwan S. Choi, Weihuang Wang, and Mark B. Yeary—"A Parallel VLSI Architecture for Layered Decoding",Proceedings of the 20th International Conference on VLSI Design, 6th International Conference: Embedded Systems, 2007, pp. 738-743.

R.Michael Tanner—"A Recursive Approach to Low Complexity Codes",IEEE transaction on Information Theory, Sep. 1981,pp. 533-547,vol. IT-27, No. 5.

Mohammad M. Mansour, and Naresh R. Shanbhag—"A 640-Mb/s 2048-Bit Programmable LDPC Decoder Chip", IEEE Journal of Solid-State Circuits, Mar. 2006, pp. 684-698,vol. 41, No. 3.

Badri N. Vellambi R, and Faramarz Fekri, "An Improved Decoding Algorithm for Low-Density Parity-Check Codes over the Binary Erasure Channel", IEEE GLOBECOM 2005 proceedings, pp. 1182-1186.

Yang Han, William E. Ryan—"Low-Floor Decoders for LDPC Codes", IEEE Transactions on Communications, vol. 57, No. 6, Jun. 2009, pp. 1663-1673.

PCT International Search Report dated Feb. 9, 2009 from International Application No. PCT/US 08/86537.

PCT International Search Report dated May 15, 2009 from International Application No. PCT/US 09/39279.

PCT International Search Report dated Feb. 12, 2009 from International Application No. PCT/US 08/86523.

PCT International Search Report dated May 28, 2009 from International Application No. PCT/US 09/41215.

PCT International Search Report dated May 15, 2009 from International Application No. PCT/US 09/39918.

Vila Casado, Andres I., Weng, Wen-Yen and Wesel, Richard D. "Multiple Rate Low-Density Parity-Check Codes with Constant Blocklength," IEEE 2004, pp. 2010-2014.

Vila Casado, Andres I. "Variable-rate Low-denisty Parity-check Codes with Constant Blocklength," UCLA Technologies Available for Licensing Copyright © 2009 The Regents of the University of California. http://www.research.ucla.edu/tech/ucla05-074.htm (2 pages).

Vila Casado, Andres I., Weng, Wen-Yen, Valle, Stefano and Wesel, Richard D. "Multiple-Rate Low-Density Parity-Check Codes with Constant Blocklength," IEEE Transactions on Communications, vol. 57, No. 1, Jan. 2009; pp. 75-83.

K. Gunnam et al., "Value-Reuse Properties of Min-Sum for GF(q)" (dated Oct. 2006) Dept. of ECE, Texas A&M University Technical Note, published about Aug. 2010.

K. Gunnam et al., "Value-Reuse Properties of Min-Sum for GF (q)" (dated Jul. 2008) Dept. of ECE, Texas A&M University Technical Note, published about Aug. 2010.

K. Gunnam "Area and Energy Efficient VLSI Architectures for Low-Density Parity-Check Decoders Using an On-The-Fly Computation" dissertation at Texas A&M University, Dec. 2006.

Al-Qerem, Ahmad H., "Congestion Control by Using a Buffered Omega Network," IADIS International Conference on Applied Computing 2005, pp. 429-434.

Mahajan, Rita and Vig, Dr. Renu, "Performance and Reliability Analysis of New Fault-Tolerant Advance Omega Network," WSEAS Transactions on Computers, Issue 8, vol. 7, Aug. 2008, pp. 1280-1290.

Aljundi, Ahmad Chadi et al., "A Study of an Evaluation Methodology for Unbuffered Multistage Interconnection Networks", Proceedings of 17th International Parallel and Distributed Processing Symposium, IPDPS '03, pp. 1-8.

Cavus et al., "A Performance Improvement and Error Floor Avoidance Technique for Belief Propagation Decoding of LDPC Codes," IEEE 16th International Symposium, Personal, Indoor & Mobile Radio Communications (PIMRC), Berlin, Germany Sep. 11-14, 2005, pp. 2386-2390.

Cavus, Enver et al., "An IS Simulation Technique for Very Low BER Performance Evaluation of LDPC Codes," IEEE International Conference on Communications, Jun. 1, 2006, pp. 1095-1100.

Cole, Chad A. and Hall, Eric K., "Analysis and Design of Moderate Length Regular LDPC Codes with Low Error Floors," Proc, 40th Conf. Information Sciences and Systems, Princeton, NJ, 2006, 6 pgs.

Richardson, Tom, "Error Floors of LDPC Codes," Allerton Conf. on Communication, Control and Computing, (Monticello, Illinois), Oct. 2003, pp. 1426-1435.

Gunnam, Kiran K., Choi, Gwan S., and Yeary, Mark B., "Technical Note on Iterative LDPC Solutions for Turbo Equalization," Texas A&M Technical Note, Department of ECE, Texas A&M University, College Station, TX 77843, Jul. 2006 (available online at http://dropzone.tamu.edu), pp. 1-5.

Jaros, J., "Evolutionary Optimization of Multistage Interconnection Networks Performance," Jul. 8, 2009; GECCO 09.

Schack, C. et al., A Multiprocessor Architecture with an Omega Network for the Massively Parallel Model GCA, 2009, Springer-Verlag.

\* cited by examiner

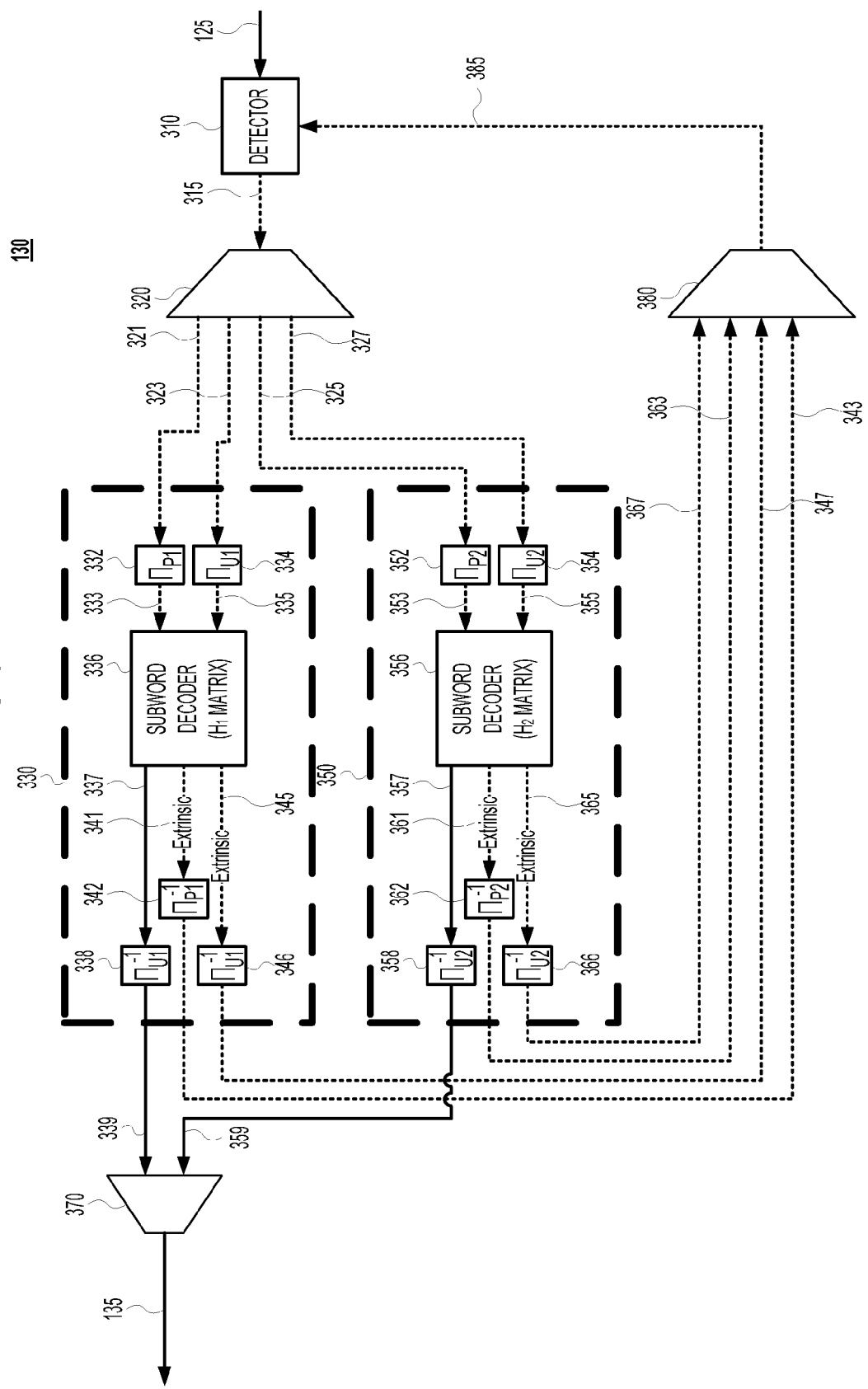

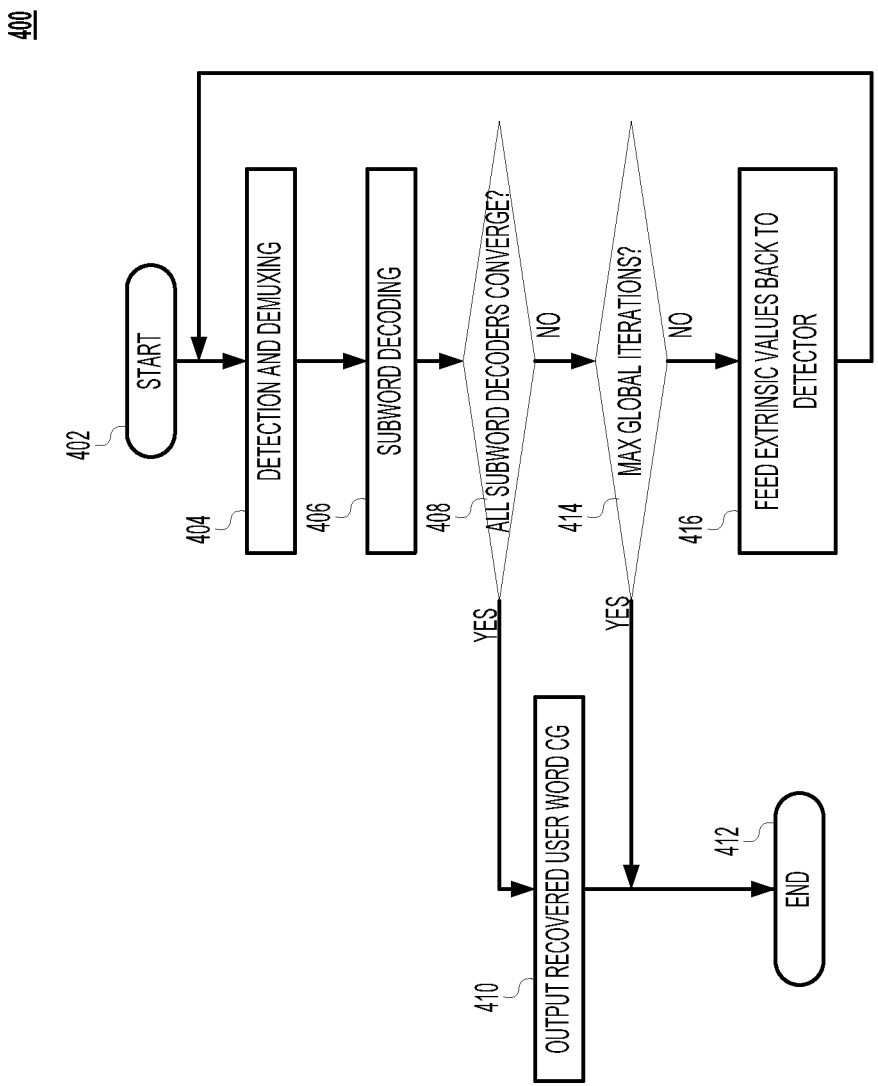

SUBWORDS CODING USING DIFFERENT INTERLEAVING SCHEMES

CROSS-REFERENCE TO RELATED APPLICATIONS

This application claims the benefit of the filing date of U.S. provisional application No. 61/262,721, filed on Nov. 19, 2009, the teachings of which are incorporated herein by reference in their entirety.

The subject matter of this application is related to (1) the subject matter of U.S. application Ser. No. 12/420,535 filed on Apr. 8, 2009, (2) the subject matter of U.S. application Ser. No. 12/333,840 filed on Dec. 12, 2008, (3) the subject matter of PCT application no. PCT/US08/86523 filed on Dec. 12, 2008, (4) the subject matter of PCT application no. PCT/US08/86537 filed on Dec. 12, 2008, (5) the subject matter of PCT application no. PCT/US09/39918 filed on Apr. 8, 2009, (6) the subject matter of U.S. application Ser. No. 12/401,116 filed on Mar. 10, 2009, (7) the subject matter of U.S. application Ser. No. 12/475,786 filed on Jun. 1, 2009, (8) the subject matter of U.S. application Ser. No. 12/260,608 filed on Oct. 29, 2009, (9) the subject matter of PCT application no. PCT/US09/41215 filed on Apr. 21, 2009, (10) the subject matter of PCT application no. PCT/US09/39279 filed on Apr. 2, 2009, (11) the subject matter of U.S. application Ser. No. 12/323,626 filed on Nov. 26, 2008, (12) the subject matter of U.S. application Ser. No. 12/427,786 filed on Apr. 22, 2009, (13) the subject matter of U.S. application Ser. No. 12/492,328 filed on Jun. 26, 2009, (14) the subject matter of U.S. application Ser. No. 12/492,346 filed on Jun. 26, 2009, (15) the subject matter of U.S. application Ser. No. 12/492,357 filed on Jun. 26, 2009, (16) the subject matter of U.S. application Ser. No. 12/492,374 filed on Jun. 26, 2009, (17) the subject matter of US patent publication no. 2008/0276156 published on Nov. 6, 2008, (18) the subject matter of US patent publication no. 2008/0301521 published on Dec. 4, 2008, (19) the subject matter of U.S. application Ser. No. 12/510,639 filed on Jul. 28, 2009, (20) the subject matter of U.S. application Ser. No. 12/510,722 filed on Jul. 28, 2009, (21) the subject matter of U.S. application Ser. No. 12/510,667 filed on Jul. 28, 2009, (22) the subject matter of U.S. application Ser. No. 12/540,078 filed on Aug. 12, 2009, (23) the subject matter of U.S. application Ser. No. 12/538,915 filed on Aug. 11, 2009, (24) the subject matter of U.S. application Ser. No. 12/540,035 filed on Aug. 12, 2009, (25) the subject matter of U.S. application Ser. No. 12/540,035 filed on Aug. 12, 2009, (26) the subject matter of U.S. application Ser. No. 12/540,002 filed on Aug. 12, 2009, and (27) the subject matter of U.S. application Ser. No. 12/644,622 filed on the same date as this application, the teachings of which are incorporated herein by reference in their entirety.

BACKGROUND OF THE INVENTION

1. Field of the Invention

The invention relates to digital signal processing, and, in particular, to data-encoding methods such as low-density parity check (LDPC) coding.

2. Description of the Related Art

Communication is the transmission of information from a transmitter to a receiver over a communications channel. In the real world, the communications channel is a noisy channel, providing to the receiver a distorted version of the information transmitted from the transmitter. A storage device (e.g., hard disk (HD) drive, flash drive) is one such noisy channel, accepting information from a transmitter, storing that information, and then providing a more or less distorted version of that information to a receiver.

The distortion introduced by a communications channel such as a storage device might be great enough to cause a channel error, i.e., where the receiver interprets the channel output signal as a 1 when the channel input signal was a 0, or vice versa. Channel errors reduce throughput and are thus undesirable. Hence, there is an ongoing need for tools that detect and/or correct channel errors. Low-density parity check (LDPC) coding is one method for the detection and correction of channel errors.

LDPC codes are among the known near-Shannon-limit codes that can achieve very low bit-error rates (BER) for low signal-to-noise ratio (SNR) applications. LDPC decoding is distinguished by its potential for parallelization, low implementation complexity, low decoding latency, as well as less-severe error floors at high SNRs. LDPC codes are considered for virtually all the next-generation communication standards.

Interleaving is another technique commonly used in communications systems to overcome correlated channel noise such as burst errors or fading. An interleaver rearranges input data such that consecutive bits in the input data are located in non-consecutive locations in the output data. At the receiver, a deinterleaver rearranges the interleaved data back into the original sequence. As a result of interleaving, correlated noise introduced in the transmission channel appears to be statistically independent at the receiver and thus allows better error correction.

Communications systems can use parallel processing to reduce encoding/decoding time. In a typical implementation, the system comprises x subword encoders and x subword decoders. The system separates an original user word into x user subwords, encodes each user subword with a separate subword encoder, decodes each encoded subword with a separate subword decoder, and recombines the recovered user subwords into a recovered user word. Such a system is known as a subwords coding system, and the process performed by the system is subwords coding. Subwords are also known as component codewords.

SUMMARY OF THE INVENTION

In a communications system that demultiplexes user data words into multiple sub-words for encoding and decoding within different subword-processing paths, the minimum distance between bit errors in an extrinsic codeword can be increased by having corresponding interleavers/deinterleavers in the different subword-processing paths use different interleaving/deinterleaving algorithms.

BRIEF DESCRIPTION OF THE DRAWINGS

Other aspects, features, and advantages of the invention will become more fully apparent from the following detailed description, the appended claims, and the accompanying drawings in which like reference numerals identify similar or identical elements.

FIG. 3 is a block diagram of subwords turbo-equalizer 130 of FIG. 1 according to various embodiments of the present invention.

FIG. 4 is a simplified flowchart of global iteration process 400 performed by subwords turbo-equalizer 130 of FIG. 1, according to various embodiments of the present invention.

DETAILED DESCRIPTION

Figure 1:
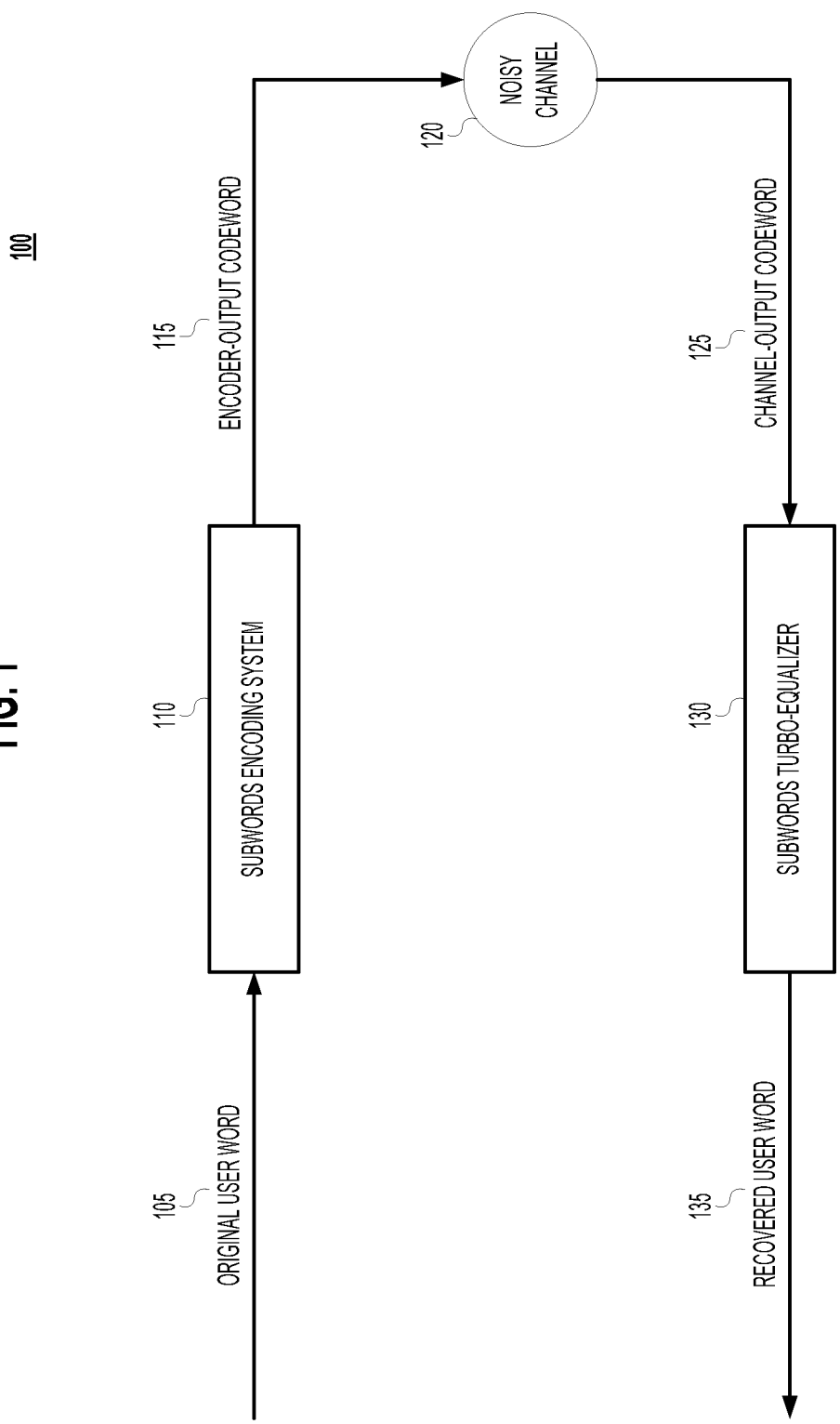
FIG. 1 is a block diagram of a communications system 100 that utilizes LDPC coding, according to various embodiments of the present invention.

FIG. 1 is a block diagram of a communications system 100 that utilizes LDPC coding, according to various embodiments of the present invention. Subwords encoding system 110 encodes original user word 105 and transmits an encoder-output codeword 115 to a noisy channel 120 (e.g., a hard-disk drive). Noisy channel 120 outputs channel-output codeword 125 to subwords turbo-equalizer 130 which decodes channel-output codeword 125 to generate recovered user word 135.

Figure 2:
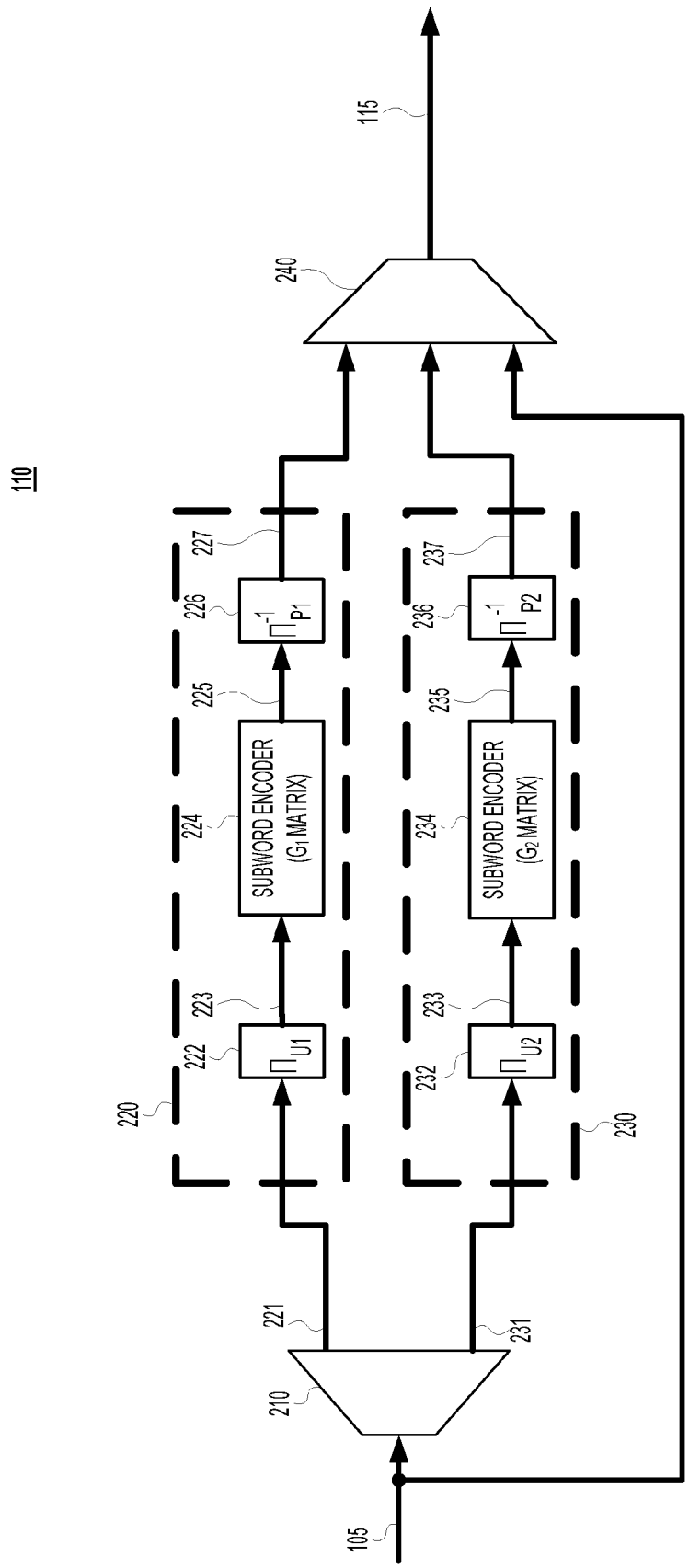
FIG. 2 is a block diagram of subwords encoding system 110 of FIG. 1 according to various embodiments of the present invention.

FIG. 2 is a block diagram of subwords encoding system 110 of FIG. 1 according to various embodiments of the present invention. Original-user-word demux 210 is a 2-way bitwise demultiplexer that demultiplexes original user word 105 into a first user subword 221 comprising the even-numbered bits of original user word 105 and a second user subword 231 comprising the odd-numbered bits of the original user word. Demux 210 sends first user subword 221 to encoding subsystem 220 and second user subword 231 to encoding subsystem 230.

The encoding process of encoding subsystem 220 is as follows. Subword interleaver 222 interleaves first user subword 221 with subword-interleaving algorithm $\Pi_{U1}$ and transmits interleaved subword 223 to subword encoder 224. Subword encoder 224 is an LDPC encoder that encodes interleaved subword 223 using LDPC encoder matrix $G_1$ and outputs a set 225 of associated parity bits—a parity set—to parity deinterleaver 226. Parity deinterleaver 226 deinterleaves parity set 225 with parity deinterleaving-algorithm $\Pi_{P1}^{-1}$ and outputs deinterleaved parity set 227 to codeword mux 240.

Encoding subsystem 230 is analogous to encoding subsystem 220 and performs an analogous encoding process on second user subword 231 to generate parity set 237. In particular, subword interleaver 232 interleaves second user subword 231 using subword-interleaving algorithm $\Pi_{U2}$ and outputs interleaved subword 233. Subword encoder 234 encodes interleaved subword 223 using LDPC encoder matrix $G_2$ and outputs parity set 235. Parity deinterleaver 236 deinterleaves parity set 235 with parity deinterleaving-algorithm $\Pi_{P2}^{-1}$ and outputs deinterleaved parity set 237 to codeword mux 240.

Codeword mux 240 multiplexes original user word 105 and deinterleaved parity sets 227 and 237 to generate encoder-output codeword 115.

FIG. 3 is a block diagram of subwords turbo-equalizer 130 of FIG. 1 according to various embodiments of the present invention. In FIG. 3, solid lines represent hard values, and dotted lines represent log-likelihood ratios (LLRs), a.k.a. soft values. The term "hard value" refers to a value comprising a single bit. The term "soft value" refers to a value comprising a hard-decision bit (i.e., the most-significant bit) and a number of confidence-value bits (i.e., the least-significant bits). Depending on the implementation, soft-output values can be implemented in, for example, sign-magnitude format, two's complement format, or any other suitable format.

Detector 310 receives channel-output codeword 125 from noisy channel 120 as a series of samples and stores the samples in a sample buffer (not shown). Detector 310 then performs a detection process, wherein the stored samples are read from the buffer, and a suitable detection technique, e.g., Viterbi detection or maximum a posteriori (MAP) detection, is executed to convert the read samples into the soft values of detector-output codeword 315. As will be discussed in greater detail below, detector 310 might receive an extrinsic codeword 385 and use the soft values in the extrinsic codeword to adjust the detection process, which adjustment is also known as turbo equalization.

Codeword demux 320 demultiplexes detector-output codeword 315 into (i) subword 323 corresponding to first user subword 221 of FIG. 2, (ii) subword 327 corresponding to second user subword 231 in FIG. 2, (iii) deinterleaved parity set 321 corresponding to deinterleaved parity set 227 in FIG. 2, and (iv) deinterleaved parity set 325 corresponding to deinterleaved parity set 237 in FIG. 2.

Subword 323 and deinterleaved parity set 321 are sent to decoding subsystem 330. The decoding process of decoding subsystem 330 is as follows. Parity interleaver 332 interleaves deinterleaved parity set 321 using parity-interleaving algorithm $\Pi_{P1}$ to generate parity set 333. Parity-interleaving algorithm $\Pi_{P1}$ is the inverse of parity-deinterleaving algorithm $\Pi_{P1}^{-1}$ used by parity deinterleaver 226 of FIG. 2 and, therefore, parity set 333 corresponds to parity set 224. Subword interleaver 334 uses subword-interleaving algorithm $\Pi_{U1}$ to interleave subword 323 to generate interleaved subword 335. Subword-interleaving algorithm $\Pi_{U1}$ is also used by subword interleaver 222 of FIG. 2 and, therefore, interleaved subword 335 corresponds to interleaved subword 223 of FIG. 2.

Subword decoder 336 is an LDPC decoder that decodes interleaved subword 335 and parity set 333 using decoder matrix $H_1$. Subword decoder 336 outputs (i) interleaved decoded subword 337 to decoded-subword deinterleaver 338, (ii) extrinsic parity set 341 to extrinsic-parity deinterleaver 342, and (iii) interleaved extrinsic subword 345 to extrinsic-subword deinterleaver 346. A more-detailed discussion of LDPC decoders, the LDPC decoding process, and extrinsic data can be found in PCT application no. PCT/US08/86523, which is incorporated herein by reference in its entirety.

Decoded-subword deinterleaver 338 deinterleaves interleaved decoded subword 337 and sends decoded subword 339 to recovered-user-word mux 370. Decoded-subword deinterleaver 338 uses subword-deinterleaving algorithm $\Pi_{U1}^{-1}$, which is the inverse of subword-interleaving algorithm $\Pi_{U1}$ used by subword interleavers 334 and 222. Therefore, decoded subword 339 corresponds to subword 323 and subword 221 of FIG. 2.

Extrinsic-parity deinterleaver 342 deinterleaves extrinsic parity set 341 and sends extrinsic deinterleaved parity set 343 to extrinsic-codeword mux 380. Extrinsic-parity deinterleaver 342 uses parity-deinterleaving algorithm $\Pi_{P1}^{-1}$, which is (i) analogous to the parity-deinterleaving algorithm executed by parity deinterleaver 226 and (ii) the inverse of the interleaving algorithm executed by parity interleaver 332. Thus, deinterleaved parity set 343 corresponds to both deinterleaved parity set 321 and deinterleaved parity set 227 of FIG. 2.

Extrinsic-subword deinterleaver 346 deinterleaves interleaved extrinsic subword 345 and sends extrinsic subword 347 to extrinsic-codeword mux 380. Extrinsic-subword deinterleaver 346 executes deinterleaving algorithm $\Pi_{U1}^{-1}$, which is the inverse of subword-interleaving algorithm $\Pi_{U1}$ executed by both subword interleaver 334 and subword interleaver 222 of FIG. 2. Thus, extrinsic subword 347 corresponds to subword 323 and subword 221 of FIG. 2.

Decoding subsystem 350 is analogous to decoding system 330. Parity interleaver 352 interleaves deinterleaved parity set 325 using parity-interleaving algorithm $\Pi_{P2}$ and outputs parity set 353 to subword decoder 356. Subword interleaver 354 uses subword-interleaving algorithm $\Pi_{U2}$ to interleave subword 327 and outputs interleaved subword 355 to subword decoder 356.

Subword decoder 356, decodes parity set 353 and interleaved subword 355 using decoder matrix $H_2$, and outputs (i) interleaved decoded subword 357 to decoded-subword deinterleaver 358, (ii) extrinsic parity set 361 to extrinsic-parity deinterleaver 362, and (iii) interleaved extrinsic subword 365 to extrinsic-subword deinterleaver 366. Decoded-subword deinterleaver 358 deinterleaves interleaved decoded subword 357 using subword-deinterleaving algorithm $\Pi_{U2}^{-1}$ and sends decoded subword 359 to recovered-user-word mux 370. Extrinsic-parity deinterleaver 362 deinterleaves extrinsic parity set 361 with parity-deinterleaving algorithm $\Pi_{P2}^{-1}$ and sends extrinsic deinterleaved parity set 363 to extrinsic-codeword mux 380. Extrinsic-subword deinterleaver 366 deinterleaves interleaved extrinsic subword 365 with subword-deinterleaving algorithm $\Pi_{U2}^{-1}$ and sends extrinsic subword 367 to extrinsic-codeword mux 380.

Recovered-user-word mux multiplexes decoded subwords 339 and 359 and outputs recovered user word 135. Extrinsic-codeword mux 380 multiplexes (i) extrinsic subword 367, (ii) extrinsic deinterleaved parity set 363, (ii) extrinsic subword 347, and (iv) extrinsic deinterleaved parity set 343, and outputs extrinsic codeword 385 to detector 310.

Subwords turbo-equalizer 130 performs one or more global decoding iterations, a.k.a. global iterations, on each channel-output codeword 125 received from noisy channel 120. A more-detailed discussion of turbo-equalization and global iterations can be found in PCT application no. PCT/US09/392, which is incorporated herein by reference in its entirety. However, the following paragraphs give a brief overview of the turbo-equalization process.

FIG. 4 is a simplified flowchart of global iteration process 400 performed by subwords turbo-equalizer 130 of FIG. 3, according to various embodiments of the present invention. Processing starts at step 402 and proceeds to step 404, where detector 310 performs detection on the samples stored in the sample buffer and outputs detector-output codeword 315 to codeword demux 320, which provides demultiplexed data to decoding subsystems 330 and 350. At step 406, decoding subsystems 330 and 350 perform an LDPC local-decoding session comprising one or more LDPC local-decoding iterations within subword decoders 336 and 356.

If a decoding subsystem converges on a decoded correct codeword, then the decoding subsystem ceases decoding the decoded correct codeword. The converged decoding subsystem preserves the hard values of the decoded correct codeword and uses the preserved hard values to generate the soft values of the extrinsic parity set (e.g., 341) and the extrinsic interleaved subword (e.g., 345). Namely, if a hard value is 0, then the corresponding extrinsic soft value is set to the maximum positive value, and, if a hard value is 1, then the corresponding extrinsic soft value is set to the maximum negative value.

If, at step 408, both decoding subsystems 330 and 350 converge on decoded correct codewords, then, at step 410, recovered-user-word mux 370 of subwords turbo-equalizer 130 outputs recovered user word 135, and global-decoding iteration process 400 terminates at step 412.

If, instead, at step 408, one or more decoding subsystems fail to converge, then, at step 410, it is determined whether the number of global iterations performed so far has reached a pre-defined threshold. If not, then, at step 416, extrinsic-codeword mux 380 sends extrinsic codeword 385 back to detector 310, and processing loops back to step 404 to perform another global iteration. Detector 310 will again perform detection on the entire codeword, i.e., all subwords. However, any converged decoding subsystems will ignore the soft values (e.g., 321, 323) from detector 310.

Detector 310 uses extrinsic codeword 385 from the previous global decoding iteration to improve detection. For example, in Viterbi detection, extrinsic values are used to improve the branch-metric calculation. Additionally, detector 310 might use the extrinsic values in the calculation of the soft values that make up detector-output codeword 315. Step 416 and detector 310 use of the extrinsic codeword from the previous global iteration to improve detection constitute the core of the turbo-equalization process.

However, different extrinsic codewords can have different effects on the detection process. Specifically, an extrinsic codeword that contains one or more sequential bit errors can reduce the effectiveness of the detection process. A sequential bit error is a sequence of two or more consecutive bit errors.

Communications system 100 will tend to generate extrinsic codewords 385 with one or more sequential bit errors if (i) corresponding interleavers/deinterleavers in different subword-processing paths use identical interleaving/deinterleaving algorithms and (ii) encoders/decoders in different subword processing paths use identical encoder/decoder matrices.

A subword-processing path is the path followed by a particular subword and its associated parity set in system 100. Thus, another way to view system 100 is as an LDPC encoding/decoding system with two subword-processing paths: a first subword-processing path for subword 221 and a second subword-processing path for subword 231. The subword-processing path for subword 221 comprises encoding subsystem 220, codeword mux 240, noisy channel 120, detector 310, codeword demux 320, subword decoder 330, recovered-user-word mux 370, and extrinsic-codeword mux 380. The subword-processing path for subword 231 is similar to the subword-processing path for subword 221, except that subword encoder 230 replaces subword encoder 220, and subword decoder 350 replaces subword decoder 330.

A subword decoder using a specific decoder matrix H will tend to generate bit errors in the same locations in the decoded subword (e.g., extrinsic subword), even when decoding different input subwords. Thus, if subword decoders 336 and 356 are using the same decoder matrix, i.e., $H_1 = H_2$, then the two decoders will tend to generate bit errors in the same locations even when they are decoding different subwords. For example, if subword decoder 336 generates interleaved extrinsic subword 345 with a bit error at location 3 (represented [0, 1, 2, 3, 4, 5, 6, 7]), then it is possible that subword decoder 356 will generate interleaved extrinsic subword 365 with a bit error at the same location (represented [0, 1, 2, 3, 4, 5, 6, 7]), even though subword 355 is different from subword 335.

If the subword-processing paths for subwords 221 and 231 use the same interleaving/deinterleaving algorithms and if interleaved extrinsic subwords 345 and 365 have bit errors in the same locations, then extrinsic subwords 347 and 367 will have bit errors in the same locations. Continuing the example from the previous paragraph, if extrinsic-subword deinterleaver 346 receives an interleaved extrinsic subword 345 of [0, 1, 2, 3, 4, 5, 6, 7] and outputs an extrinsic subword 347 of [0, 4, 1, 5, 2, 6, 3, 7], then extrinsic-subword deinterleaver 366, upon receiving an interleaved extrinsic subword 365 of [0, 1, 2, 3, 4, 5, 6, 7], will generate an extrinsic subword 367 of [0, 4, 1, 5, 2, 6, 3, 7].

Lastly, the bitwise interleaving of extrinsic-codeword mux 380 will then place the bit errors of extrinsic subwords 367 and 347 next to each other, i.e., create sequential bit errors in extrinsic codeword 385. Continuing the example from the previous paragraph, extrinsic-codeword mux 380 will generate, before parity insertion, the following extrinsic codeword:

[0, 0, 4, 4, 1, 1, 5, 5, 2, 2, 6, 6, 3̄, 3, 7, 7]. Note that this codeword contains a sequential bit error.

Since sequential bit errors in an extrinsic codeword can inhibit proper functioning of a soft detector such as detector 310, it is desirable to reduce the occurrence of sequential bit errors in extrinsic codeword 385. One way to achieve this goal is to have corresponding interleavers/deinterleavers in different subword-processing paths execute different interleaving/deinterleaving algorithms. Another way to achieve this goal is to have the corresponding subword encoders/decoders in different subword-processing paths use different encoder/decoder matrices.

Reducing Sequential Bit Errors with Different Interleaving/Deinterleaving Algorithms As mentioned above, the number of sequential bit errors in an extrinsic codeword can be reduced by having corresponding interleavers/deinterleavers in different subword-processing paths execute different interleaving/deinterleaving algorithms. In system 100, each interleaver/deinterleaver in the subword-processing path of subword 221 uses an interleaving/deinterleaving algorithm that is different from the interleaving/deinterleaving algorithm used by the corresponding interleaver/deinterleaver in the subword processing path of subword 231. Thus, extrinsic-subword deinterleaver 346 executes a subword-deinterleaving algorithm that is different from the subword-deinterleaving algorithm executed by extrinsic-subword deinterleaver 366 (i.e., $\Pi_{U1}^{-1} \neq \Pi_{U2}^{-1}$) and so forth.

For example, assume that extrinsic-subword deinterleaver 346 receives an interleaved extrinsic subword 345 of [0, 1, 2, 3, 4, 5, 6, 7] and outputs an extrinsic subword 347 of [0, 4, 1, 5̄, 2, 6, 3, 7]. In contrast, extrinsic-subword deinterleaver 366, using a different deinterleaving algorithm, receives an interleaved extrinsic subword 365 of [0, 1, 2, 3, 4, 5, 6, 7], and generates an extrinsic subword 367 of [2, 6̄, 3, 7, 0, 4, 1, 5]. Extrinsic-codeword mux 380 bitwise multiplexes subwords 347 and 367 to generate, before parity insertion, the following extrinsic codeword: [0, 2, 4, 6, 1, 3̄, 5, 7, 2, 0, 6, 4, 3̄, 1, 7, 5]. This extrinsic codeword has no sequential bit errors.

Reducing Sequential Bit Errors with Different Encoder/Decoder Matrices

As mentioned above, the number of sequential bit errors in an extrinsic codeword can also be reduced by having corresponding subword encoders/decoders in different subword-processing paths perform encoding/decoding with different encoder/decoder matrices. Because the number and location of bit errors in a decoded codeword are determined primarily by the decoder matrix used to decode the encoded codeword, different decoder matrices can generate different numbers of bit errors, and generate bit errors in different locations.

Thus, for example, in subwords turbo-equalizer 130 of FIG. 3, assume that subword decoders 336 and 356 use different decoder matrices, i.e., $H_1 \neq H_2$, where decoder matrix $H_1$ tends to generate bit errors in location 3, while decoder matrix $H_2$ tends to generate bit errors in location 7. Thus, if the same interleaving/deinterleaving algorithms are employed by both subword-processing paths, the resulting extrinsic codeword generated will have no consecutive bit errors.

Many LDPC matrices used today are "array" matrices constructed out of smaller matrices called blocks. Blocks are p×p matrices where p is a prime number. Typically, each block in an array matrix is either (i) a zero matrix, (ii) an identity matrix, or (iii) a cyclically shifted identity matrix. For example, a typical array matrix H is a regular quasi-cyclic matrix, given by the following Equation (3):

$$H = \begin{pmatrix} I & I & I & \cdots & I \\ I & \alpha & \alpha^2 & \cdots & \alpha^{k-1} \\ I & \alpha^2 & \alpha^4 & \cdots & \alpha^{2(k-1)} \\ \vdots & \vdots & \vdots & & \vdots \\ I & \alpha^{j-1} & \alpha^{(j-1)2} & \cdots & \alpha^{(j-1)(k-1)} \end{pmatrix} \quad (3)$$

where I is a p×p identity matrix, j is the number of rows of blocks in matrix H, k is the number of columns of blocks in matrix H, α is matrix I cyclically right-shifted by 1 column, and the exponent of α indicates the number of cyclic right shifts performed on matrix I. A vertical column of blocks is called a block column.

One way to generate two different encoder or decoder matrices is to permute an initial array matrix H by cyclically right-shifting the block columns of H to generate a new array matrix $H^P$, where P is the number of cyclic right shifts, also known as the offset. Thus, for example, a first array matrix $H_1$ is created with four block columns, denoted {1, 2, 3, 4}. $H_1$ is cyclically right-shifted once, i.e., an offset of 1, to generate a second array matrix $H_2$, with a block column composition of {4, 1, 2, 3}.

Another way to generate two different array matrices is to divide a first array matrix into two or more subsets of two or more consecutive block columns and internally cyclically right-shift each of the column subsets by a separate offset. For example, a first array matrix comprising eight block columns {1, 2, 3, 4, 5, 6, 7, 8} is divided into a first block-column subset {1, 2, 3} and a second block-column subset {4, 5, 6, 7, 8}. The first block-column subset is internally cyclically right-shifted by an offset of 1 (yielding {3, 1, 2}), and the second block-column subset is internally cyclically right-shifted by an offset of 2 (yielding {7, 8, 4, 5, 6}), yielding a second array matrix with a block column composition of {3, 1, 2, 7, 8, 4, 5, 6}.

The encoder matrix G used to encode a codeword is mathematically related to the decoder matrix H that can decode the codeword. The systematic form of an encoder matrix G that encodes a user word of length k to generate r parity bits is given by the following Equation (1):

$$G = [I_k | P] \quad (1)$$

where "|" connotes matrix concatenation, $I_k$ is a k×k identity matrix, and parity submatrix P is of the dimension k×r. The corresponding decoder matrix H is given by the following Equation (2):

$$H = [-P^T | I_r] \quad (2)$$

where "T" connotes matrix transposition. Thus, in various embodiments of the present invention, both matrices in a given subwords-processing path are altered, e.g., an encoder matrix G is cyclically shifted to generate new encoder matrix $G^P$, and a new decoder matrix H is generated from encoder matrix $G^P$ using Equation (2) above. Alternatively, a decoder matrix encoder H is cyclically shifted to yield new decoder matrix $H^P$, and a new encoder matrix G generated from decoder matrix $H^P$. In a communications system 100 according to these embodiments of the present invention, encoder matrix $G_1$ differs from encoder matrix $G_2$, and decoder matrix $H_1$ differs from decoder matrix $H_2$.

Cyclically shifting the columns of a decoder matrix is equivalent to interleaving the encoded codeword. Thus, in other embodiments of the present invention, only the decoder matrix in a given subwords-processing path is cyclically shifted. The encoder matrix remains unchanged and interleavers/deinterleavers perform the appropriate interleaving/ deinterleaving on the encoded codeword. In a communications system 100 according to these embodiments, decoder matrix $H_1$ differs from decoder matrix $H_2$, and encoder matrix $G_1$ is identical to encoder matrix $G_2$.

Although the exemplary embodiments of the present invention utilized both differing interleaving algorithms and differing encoding/decoding matrices, the invention is not so limited. Various embodiments of the present invention can utilize differing interleaving algorithms without utilizing differing encoding/decoding matrices, and vice versa.

Although the present invention has been described in the context of reducing the number of sequential bit errors in an extrinsic codeword, the effect and purpose of various embodiments of the present invention is broader, namely, increasing the minimum distance between bit errors in an extrinsic codeword. Reducing the number of sequential bit errors in an extrinsic codeword is a subset of this broader description.

Although the present invention has been described in the context of hard disk drives and flash drives, the invention is not so limited. In general, the present invention can be implemented with any system involving communications encoded using an iterative decoder.

Although the present invention has been described in the context of cyclic right shifts, the present invention can alternatively be implemented in the context of cyclic left shifts.

Although the exemplary embodiments of the present invention demultiplexed an original user word into two subwords, the invention is not so limited. Embodiments of the present invention can divide the original user word of length K into any n subwords of bit length l where nl=K.

Furthermore, although the exemplary embodiments of the present invention comprise two subword-processing paths, the invention is not so limited. Embodiments of the present invention can comprise any number of subword-processing paths.

Furthermore, although the exemplary embodiments of the present invention comprised two subword-processing paths wherein each interleaver in the first subword-processing path executed an interleaving algorithm that differed from the corresponding interleaving algorithm in the second subword-processing path, the invention is not so limited. In other embodiments of the present invention, some corresponding interleavers might execute the same interleaving algorithm, while other interleavers execute different interleaving algorithms. Similarly, some encoders/decoders might be based on the same encoder/decoder matrices, while other encoders/decoders are based on different encoder/decoder matrices.

Yet further, although the exemplary embodiments of the present invention comprise subword-processing paths that are similarly configured, the invention is not so limited. For example, in the exemplary embodiment encoding subsystems 220 and 230 have a similar configuration: a subword interleaver followed by a subword encoder followed by a parity deinterleaver. In another embodiment of the present invention, encoding subsystems 220 and 230 might be configured differently, e.g., encoding subsystem 220 might comprise a subword interleaver, a subword encoder, and a parity deinterleaver, while encoding subsystem 230 might comprise only a subword encoder and a parity deinterleaver.

Further, although the exemplary embodiments of the present invention demultiplexed an original user word into subwords using a bitwise demultiplexing algorithm, the invention is not so limited and can use any suitable demultiplexing algorithm.

In communications system 100, both user data and parity data are interleaved and deinterleaved. In other systems, interleaving/deinterleaving is applied to only user data or only parity data. Still other systems can be implemented without any interleaving/deinterleaving.

Yet further, although embodiments of the present invention have been described in the context of LDPC codes, the present invention is not so limited. Embodiments of the present invention could be implemented for any code which can be defined by a graph, e.g., tornado codes, structured IRA codes, since it is graph-defined codes which suffer from trapping sets.

As used in the following claims, unless explicitly clear from the context, the term "interleaver" refers collectively to both interleavers and deinterleavers. As will be appreciated by someone of ordinary skill in the art, "interleaver" and "deinterleaver" are relative terms that depend on the particular domains that correspond to the inputs and outputs of the corresponding interleaving/deinterleaving devices. For example, if a first device converts data from an uninterleaved domain into an interleaved domain, and a second device converts the data in that interleaved domain into a deinterleaved domain (equivalent to the uninterleaved domain), then the first device is referred to as an interleaver, and the second device as a deinterleaver. If, instead, the same first device is said to transform data from an interleaved domain into a deinterleaved domain, and the same second device is said to transform the data in that deinterleaved domain back into the interleaved domain, then the first device is referred to as a deinterleaver, and the second device as an interleaver.

Note that, in communications system 100, due to subword interleavers 222 and 232, subword encoders 220 and 230 operate on user data in an interleaved domain, and, due to subword interleavers 334 and 354 and parity interleavers 332 and 352, subword decoders 336 and 356 operate on user and parity data in the same interleaved domain. Note further that the transmitted data includes user data in the original un-interleaved domain and, due to parity deinterleavers 226 and 236, parity data in a de-interleaved domain that may be, but does not have to be equivalent to the user data's un-interleaved domain.

The present invention can be embodied in the form of methods and apparatuses for practicing those methods. The present invention can also be embodied in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium or loaded into and/or executed by a machine, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The invention claimed is:

1. An apparatus-implemented method for encoding a user word, the method comprising:
   (a) the apparatus separating the user word into at least first and second subwords;
   (b) the apparatus encoding the first subword using a first interleaving algorithm; and
   (c) the apparatus encoding the second subword using a second interleaving algorithm different from the first interleaving algorithm, wherein:
   step (b) comprises the apparatus applying the first subword to a first encoding subsystem to generate a first parity set of parity data for the first subword, wherein the first encoding subsystem comprises a first subword encoder and at least one of (i) a first subword interleaver prior to the first subword encoder and (ii) a first parity interleaver following the first subword encoder; and
   step (c) comprises the apparatus applying the second subword to a second encoding subsystem to generate a second parity set of parity data for the second subword, wherein the second encoding subsystem comprises a second subword encoder and at least one of (i) a second subword interleaver prior to the second subword encoder and (ii) a second parity interleaver following the second subword encoder, wherein:
   at least one of (i) the first subword interleaver performs a subword interleaving algorithm different from a subword interleaving algorithm of the second subword interleaver and (ii) the first parity interleaver performs a parity interleaving algorithm different from a parity interleaving algorithm of the second parity interleaver.

2. The method of claim 1, wherein:
   the method further comprises (d) the apparatus combining the first and second parity sets with the user word to generate an encoder-output codeword.

3. The method of claim 1, wherein:
   the first encoding subsystem comprises the first subword encoder, the first subword interleaver prior to the first subword encoder, and the first parity interleaver following the first subword encoder; and
   the second encoding subsystem comprises the second subword encoder, the second subword interleaver prior to the second subword encoder, and the second parity interleaver following the second subword encoder.

4. The method of claim 3, wherein:
   the subword interleaving algorithm of the first subword interleaver is different from the subword interleaving algorithm of the second subword interleaver; and
   the parity interleaving algorithm of the first parity interleaver performs is different from the parity interleaving algorithm of the second parity interleaver.

5. The method of claim 1, wherein using the different interleaving algorithms increases a minimum distance between bit errors occurring in an extrinsic codeword generated while decoding a corresponding codeword.

6. The method of claim 1, wherein the user word is separated bitwise to form the at least first and second subwords.

7. The method of claim 1, wherein:
   step (b) further comprises the apparatus encoding the first subword using a first encoder matrix; and
   step (c) further comprises the apparatus encoding the second subword using a second encoder matrix different from the first encoder matrix.

8. An apparatus for encoding a user word, the apparatus comprising:
   a demux that separates the user word into at least first and second subwords;
   a first encoding subsystem that encodes the first subword using a first interleaving algorithm; and
   a second encoding subsystem that encodes the second subword using a second interleaving algorithm different from the first interleaving algorithm, wherein:
   the first encoding subsystem comprises a first subword encoder configured to generate a first parity set of parity data for the first subword and at least one of (i) a first subword interleaver prior to the first subword encoder and (ii) a first parity interleaver following the first subword encoder; and
   the second encoding subsystem comprises a second subword encoder configured to generate a second parity set of parity data for the second subword and at least one of (i) a second subword interleaver prior to the second subword encoder and (ii) a second parity interleaver following the second subword encoder, wherein:
   at least one of (i) the first subword interleaver performs a subword interleaving algorithm different from a subword interleaving algorithm of the second subword interleaver and (ii) the first parity interleaver performs a parity interleaving algorithm different from a parity interleaving algorithm of the second parity interleaver.

9. A apparatus-implemented method for decoding a codeword, the method comprising:
   (a) the apparatus separating the codeword into at least first and second subwords and at least first and second parity sets;
   (b) the apparatus decoding the first subword and the first parity set using a first interleaving algorithm; and (c) the apparatus decoding the second subword and the second parity set using a second interleaving algorithm different from the first interleaving algorithm.

10. The method of claim 9, wherein:
in step (b), the apparatus generates a first extrinsic subword and a first extrinsic parity set;
in step (c), the apparatus generates a second extrinsic subword and a second extrinsic parity set; and
the method further comprising (d) the apparatus using the first and second extrinsic subwords and the first and second extrinsic parity sets to update the codeword for further decoding.

11. The method of claim 9, wherein:
step (b) comprises the apparatus applying the first subword and the first parity set to a first decoding subsystem to generate a first extrinsic subword and a first extrinsic parity set for the first subword, wherein the first decoding subsystem comprises a first subword decoder and at least one of (i) a first subword interleaver prior to the first subword decoder, (ii) a first parity interleaver prior to the first subword decoder, (iii) a second subword interleaver following the first subword decoder, and (iv) a second parity interleaver following the first subword decoder; and
step (c) comprises the apparatus applying the second subword and the second parity set to a second decoding subsystem to generate a second extrinsic subword and a second extrinsic parity set for the second subword, wherein the second decoding subsystem comprises a second subword decoder and at least one of (i) a third subword interleaver prior to the second subword decoder, (ii) a third parity interleaver prior to the second subword decoder, (iii) a fourth subword interleaver following the second subword decoder, and (iv) a fourth parity interleaver following the second subword decoder, wherein:
at least one of (i) the first subword interleaver performs a subword interleaving algorithm different from a subword interleaving algorithm of the third subword interleaver, (ii) the first parity interleaver performs a parity interleaving algorithm different from a parity interleaving algorithm of the third parity interleaver, (iii) the second subword interleaver performs a subword interleaving algorithm different from a subword interleaving algorithm of the fourth subword interleaver, and (iv) the second parity interleaver performs a parity interleaving algorithm different from a parity interleaving algorithm of the fourth parity interleaver.

12. The method of claim 11, wherein:
the first decoding subsystem comprises the first subword decoder, the first subword interleaver and the first parity interleaver prior to the first subword decoder, and the second subword interleaver and the second parity interleaver following the first subword decoder; and
the second decoding subsystem comprises the second subword decoder, the third subword interleaver and the third parity interleaver prior to the second subword decoder, and the fourth subword interleaver and the fourth parity interleaver following the second subword decoder.

13. The method of claim 12, wherein:
the subword interleaving algorithm of the first subword interleaver is different from the subword interleaving algorithm of the third subword interleaver,
the parity interleaving algorithm of the first parity interleaver is different from the parity interleaving algorithm of the third parity interleaver,
the subword interleaving algorithm of the second subword interleaver is different from the subword interleaving algorithm of the fourth subword interleaver, and
the parity interleaving algorithm of the second parity interleaver is different from the parity interleaving algorithm of the fourth parity interleaver.

14. The method of claim 9, wherein using the different interleaving algorithms increases a minimum distance between bit errors occurring in an extrinsic codeword generated while decoding the codeword.

15. The method of claim 9, wherein the user word is separated bitwise to form the at least first and second subwords.

16. The method of claim 9, wherein:
step (b) further comprises the apparatus decoding the first subword and the first parity set using a first decoder matrix; and
step (c) further comprises the apparatus decoding the second subword and the second parity set using a second decoder matrix different from the first decoder matrix.

17. A apparatus for decoding a codeword, the method apparatus comprising:
a demux that separates the codeword into at least first and second subwords and at least first and second parity sets;
a first decoding subsystem that decodes the first subword and the first parity set using a first interleaving algorithm; and
a second decoding subsystem that decodes the second subword and the second parity set using a second interleaving algorithm different from the first interleaving algorithm.

18. An apparatus-implemented method for encoding a user word, the method comprising:
(a) the apparatus separating the user word into at least first and second subwords;
(b) the apparatus encoding the first subword using a first interleaving algorithm; and
(c) the apparatus encoding the second subword using a second interleaving algorithm different from the first interleaving algorithm, wherein:
in step (b), the apparatus generates a first parity set of parity data for the first subword;
in step (c), the apparatus generates a second parity set of parity data for the second subword; and
the method further comprises (d) the apparatus combining the first and second parity sets with the user word to generate an encoder-output codeword.

19. An apparatus-implemented method for encoding a user word, the method comprising:
(a) the apparatus separating the user word into at least first and second subwords;
(b) the apparatus encoding the first subword using a first interleaving algorithm; and
(c) the apparatus encoding the second subword using a second interleaving algorithm different from the first interleaving algorithm, wherein:
step (b) further comprises the apparatus encoding the first subword using a first encoder matrix; and
step (c) further comprises the apparatus encoding the second subword using a second encoder matrix different from the first encoder matrix.

20. An apparatus for encoding a user word, the apparatus comprising:
a demux that separates the user word into at least first and second subwords;
a first encoding subsystem that encodes the first subword using a first interleaving algorithm; and a second encoding subsystem that encodes the second subword using a second interleaving algorithm different from the first interleaving algorithm, wherein:

the first encoding subsystem is configured to generate a first parity set of parity data for the first subword;

the second encoding subsystem is configured to generate a second parity set of parity data for the second subword; and the encoder further comprises a mux configured to combine the first and second parity sets with the user word to generate an encoder-output codeword.

21. An apparatus for encoding a user word, the encoder comprising:

a demux that separates the user word into at least first and second subwords;

a first encoding subsystem that encodes the first subword using a first interleaving algorithm; and a second encoding subsystem that encodes the second subword using a second interleaving algorithm different from the first interleaving algorithm, wherein:

the first encoding subsystem is configured to encode the first subword using a first encoder matrix; and the second encoding subsystem is configured to encode the second subword using a second encoder matrix different from the first encoder matrix.

* * * * *